United States Patent
Happ et al.

(10) Patent No.: US 7,863,593 B2
(45) Date of Patent: Jan. 4, 2011

(54) INTEGRATED CIRCUIT INCLUDING FORCE-FILLED RESISTIVITY CHANGING MATERIAL

(75) Inventors: Thomas Happ, Tarrytown, NY (US); Jan Boris Philipp, Peekskill, NY (US)

(73) Assignee: Qimonda AG, Munich (DE)

( * ) Notice: Subject to any disclaimer, the term of this patent is extended or adjusted under 35 U.S.C. 154(b) by 89 days.

(21) Appl. No.: 11/780,849

(22) Filed: Jul. 20, 2007

(65) Prior Publication Data

US 2009/0020738 A1    Jan. 22, 2009

(51) Int. Cl.
*H01L 29/02* (2006.01)

(52) U.S. Cl. .................. 257/2; 257/3; 257/4; 257/5; 438/102

(58) Field of Classification Search ............. 257/1–5; 438/102–103
See application file for complete search history.

(56) References Cited

U.S. PATENT DOCUMENTS

| | | | |
|---|---|---|---|
| 4,177,475 A * | 12/1979 | Holmberg | 257/2 |
| 5,508,212 A | 4/1996 | Wang et al. | |
| 5,920,788 A * | 7/1999 | Reinberg | 438/466 |
| 6,589,865 B2 | 7/2003 | Dixit et al. | |
| 6,764,894 B2 | 7/2004 | Lowrey | |
| 6,878,618 B2 | 4/2005 | Lowrey et al. | |
| 6,949,464 B1 | 9/2005 | Doan | |
| 6,961,258 B2 | 11/2005 | Lowrey | |
| 6,974,773 B2 | 12/2005 | Thakur et al. | |
| 7,005,666 B2 | 2/2006 | Dennison | |
| 7,049,623 B2 | 5/2006 | Lowrey | |
| 7,190,607 B2 | 3/2007 | Cho et al. | |
| 7,214,632 B2 | 5/2007 | Chiang | |
| 7,224,065 B2 | 5/2007 | Doan | |
| 7,511,984 B2 | 3/2009 | Liu | |
| 7,663,135 B2 | 2/2010 | Lung | |
| 2003/0041452 A1* | 3/2003 | Sinha | 29/852 |
| 2004/0113137 A1* | 6/2004 | Lowrey | 257/5 |
| 2005/0018526 A1 | 1/2005 | Lee | |
| 2005/0167645 A1* | 8/2005 | Kim et al. | 257/2 |
| 2005/0281073 A1 | 12/2005 | Cho et al. | |
| 2006/0040485 A1 | 2/2006 | Lee et al. | |
| 2006/0113573 A1 | 6/2006 | Cheong et al. | |
| 2007/0082469 A1 | 4/2007 | Peters | |

OTHER PUBLICATIONS

S.J. Ahn, et al., "Highly Manufacturable High Density Phase Change Memory of 64 Mb and Beyond", IEEE, 2004 (4 pgs.).
G.A. Dixit, et al., "A Novel High Pressure Low Temperature Aluminum Plug Technology for Sub-0.5um Contact/Via Geometries", IEEE, 1994, (5 pgs.).
Stefan Lai, "Current Status of the Phase Change Memory and its Future", IEEE, 2003 (4 pgs.).
Stefan Lai, et al., "OUM—A 180 nm Nonvolatile Memory Cell Element Technology for Stand Alone and Embedded Applications", Intel Corporation, (4 pgs.).
"Highly Scalable Phase Change Memory with CVD GeSbTe for Sub 50nm Generation", J.I. Lee, et al., Symposium on VLSI Technology Digest of Technical Papers, 2007 (2 pgs.).

* cited by examiner

*Primary Examiner*—Kimberly D Nguyen
*Assistant Examiner*—Jami M Valentine
(74) *Attorney, Agent, or Firm*—Dicke, Billig & Czaja, PLLC

(57) ABSTRACT

An integrated circuit includes a first electrode, a second electrode, and force-filled resistivity changing material electrically coupled to the first electrode and the second electrode.

6 Claims, 6 Drawing Sheets

US 7,863,593 B2

INTEGRATED CIRCUIT INCLUDING FORCE-FILLED RESISTIVITY CHANGING MATERIAL

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

The endurance of a phase change memory cell may be limited by potential chemical reactions between the phase change material of the memory cell and the materials surrounding the phase change material. Organic or reactive contaminants within the phase change material may also limit the endurance of a phase change memory cell. In addition, the endurance of a phase change memory cell may be limited by the intrinsic phase change material morphology.

For these and other reasons, there is a need for the present invention.

SUMMARY

One embodiment provides an integrated circuit. The integrated circuit includes a first electrode, a second electrode, and force-filled resistivity changing material electrically coupled to the first electrode and the second electrode.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
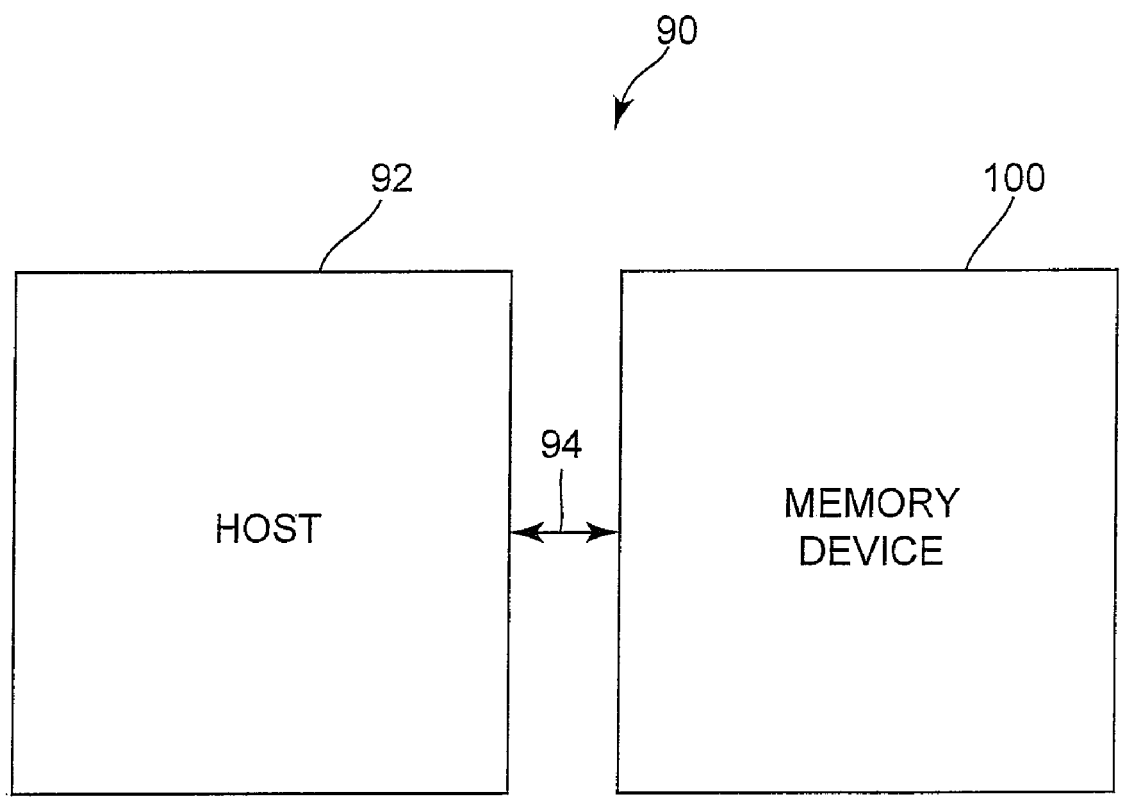
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
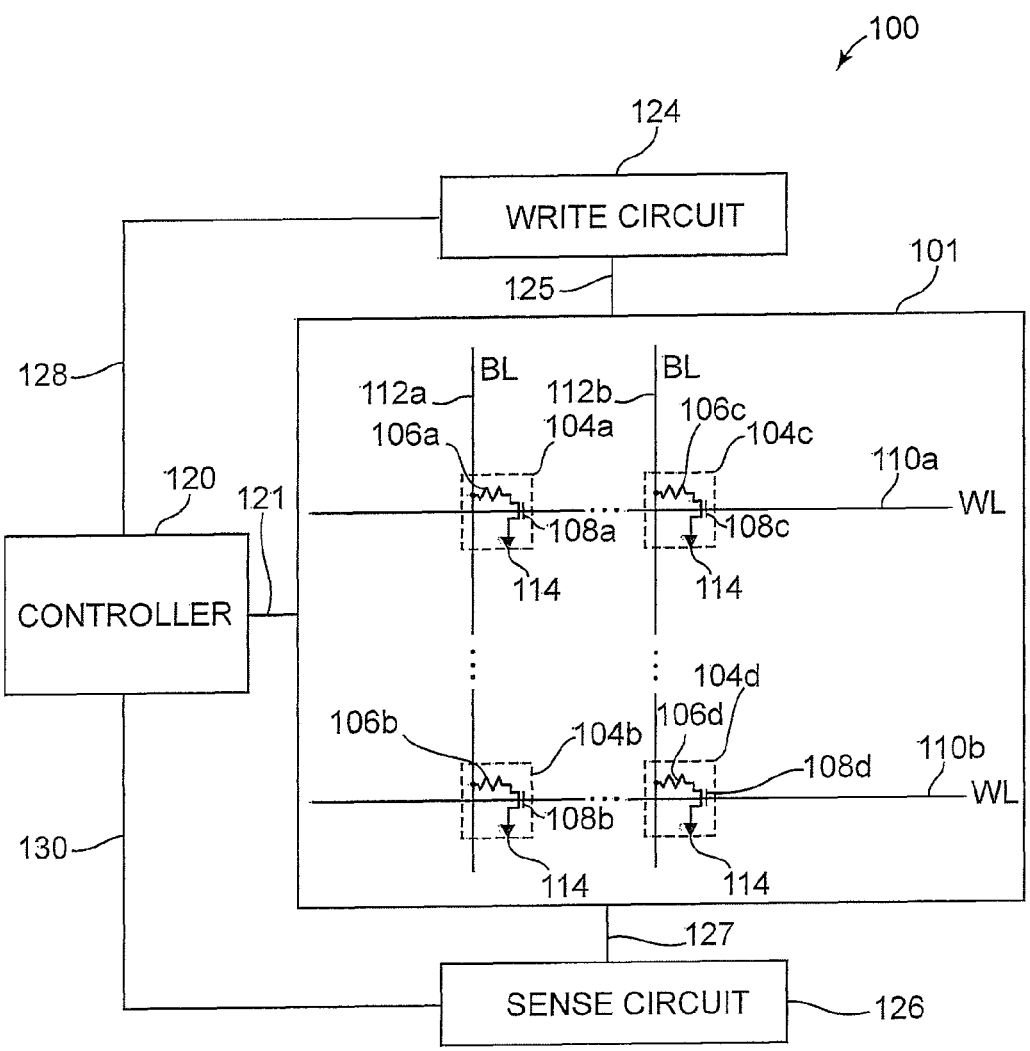
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes write circuit 124, controller 120, memory array 101, and sense circuit 126. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110). In one embodiment, phase change memory cells 104a-104d are arranged in rows and columns.

Each phase change memory cell 104 includes phase change material deposited in an opening formed in a dielectric material layer. The phase change material is sputter deposited such that no organic or reactive contaminants are introduced into the phase change material. The sputter deposition does not completely fill the opening thus leaving a void or voids in the opening. A force-fill process is then used to force the phase change material into the void or voids. In this way, any voids within the opening are filled with the organic or reactive contaminant free phase change material. The void free and organic or reactive contaminant free phase change material increases the endurance of the phase change memory cell over typical phase change memory cells.

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a bit line 112, and a common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode-like structure may be used in place of transistor 108. In this case, a diode and phase change element 106 is coupled in series between each cross point of word lines 110 and bit lines 112.

Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

Each phase change element 106 comprises a phase change material that may be made up of a variety of materials in accordance with the present invention. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states can be three states and a ternary system can be used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

During a set operation of phase change memory cell 104a, one or more set current or voltage pulses are selectively enabled by write circuit 124 and sent through bit line 112a to phase change element 106a thereby heating phase change element 106a above its crystallization temperature (but usually below its melting temperature) with word line 110a selected to activate transistor 108a. In this way, phase change element 106a reaches its crystalline state or a partially crystalline and partially amorphous state during this set operation.

During a reset operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state. Phase change memory cells 104b-104d and other phase change memory cells 104 in memory array 101 are set and reset similarly to phase change memory cell 104a using a similar current or voltage pulse.

Figure 3:
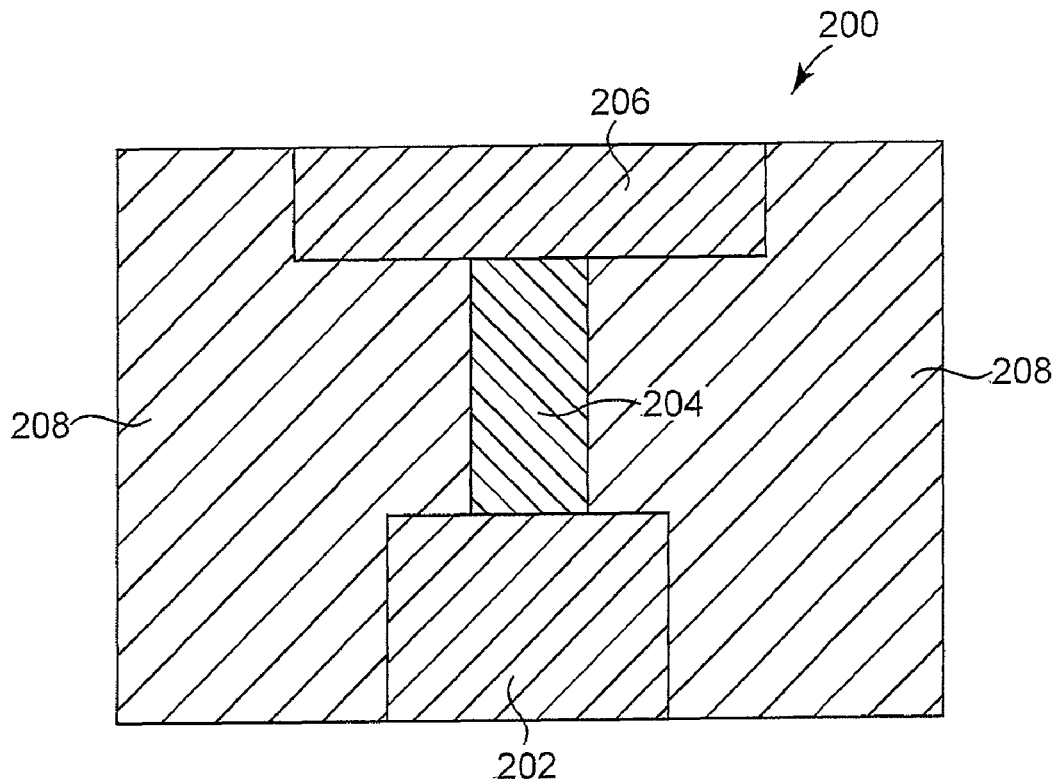
FIG. 3 illustrates a cross-sectional view of one embodiment of a phase change element.

FIG. 3 illustrates a cross-sectional view of one embodiment of a phase change element 200. In one embodiment, each phase change element 106 is similar to phase change element 200. Phase change element 200 includes a bottom electrode 202, a phase change material storage location 204, a top electrode 206, and dielectric material 208. In one embodiment, phase change material storage location 204 is a via or pore phase change material storage location.

Bottom electrode 202 includes TiSiN, TaSiN, TiAlN, TaAlN, W, WN, C, MoN, TiN, TaN, Ti, Ta, Pt, Ir, or other suitable electrode material. The top of bottom electrode 202 contacts the bottom of phase change material storage location 204. Phase change material storage location 204 includes force-filled organic or reactive contaminant free phase change material. In one embodiment, phase change material storage location 204 includes two or more layers of phase change material or a graded composition of two or more phase change materials. Phase change material storage location 204 provides a storage location for storing one or more bits of data. In one embodiment, the cross-sectional width of phase change material storage location 204 is less than the cross-sectional width of bottom electrode 202.

The top of phase change material storage location 204 contacts the bottom of top electrode 206. Top electrode 206 includes TiSiN, TaSiN, TiAlN, TaAlN, W, WN, C, MoN, TiN, TaN, Ti, Ta, Pt, Ir, or other suitable electrode material. In one embodiment, the cross-sectional width of top electrode 206 is greater than the cross-sectional width of phase change material storage location 204. Bottom electrode 202, phase change material storage location 204, and top electrode 206 are laterally surrounded by dielectric material 208. Dielectric material 208 includes $TaO_x$, $Al_2O_3$, SiON, $SiO_2$, $SiO_x$, SiN, fluorinated silica glass (FSG), boro-phosphorous silicate glass (BPSG), boro-silicate glass (BSG), or other suitable dielectric material. In another embodiment, the dielectric material laterally surrounding phase change material storage location 204 is different than the dielectric material laterally surrounding bottom electrode 202 and/or top electrode 206.

The current path through phase change element 200 is from top electrode 206 and phase change material storage location 204 to bottom electrode 202. In another embodiment, the current path is reversed. During operation, current or voltage pulses are applied between top electrode 206 and bottom electrode 202 to program phase change element 200. During a set operation of phase change element 200, a set current or voltage pulse is selectively enabled by write circuit 124 and sent through a bit line to top electrode 206. From top electrode 206, the set current or voltage pulse passes through phase change material storage location 204 to bottom electrode 202. The set current or voltage thereby heats the phase change material of phase change material storage location 204 above its crystallization temperature (but usually below its melting temperature). In this way, the phase change material reaches a crystalline state or a partially crystalline and partially amorphous state during the set operation.

During a reset operation of phase change element 200, a reset current or voltage pulse is selectively enabled by write circuit 124 and sent through a bit line to top electrode 206. From top electrode 206, the reset current or voltage pulse passes through phase change material storage location 204 to bottom electrode 202. The reset current or voltage quickly heats the phase change material of phase change material storage location 204 above its melting temperature. After the current or voltage pulse is turned off, the phase change material quickly quench cools into an amorphous state or a partially amorphous and partially crystalline state.

The following FIGS. 4-10 illustrate embodiments for fabricating phase change element 200 previously described and illustrated with reference to FIG. 3.

Figure 4:
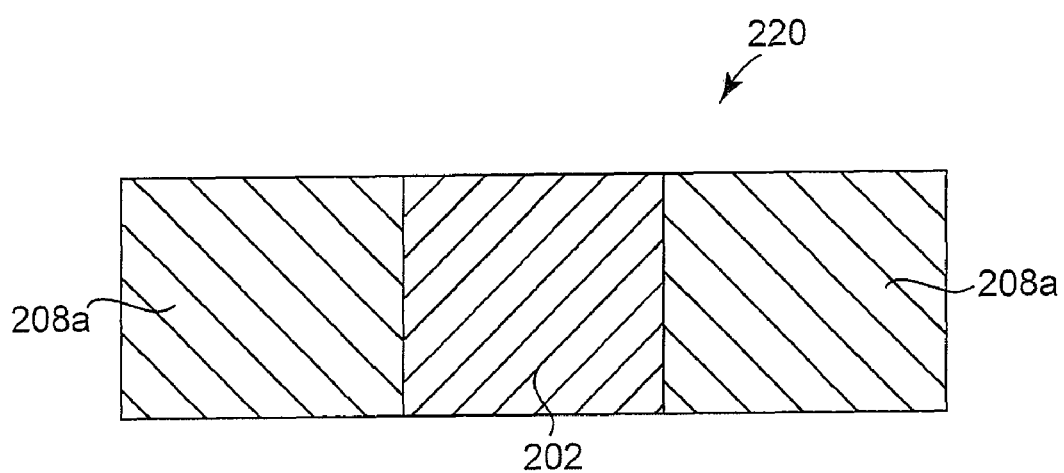
FIG. 4 illustrates a cross-sectional view of one embodiment of a preprocessed wafer.

FIG. 4 illustrates a cross-sectional view of one embodiment of a preprocessed wafer 220. Preprocessed wafer 220 includes bottom electrode 202, dielectric material 208a, and lower wafer layers (not shown). In one embodiment, the lower wafer layers include access devices, such as transistors or diodes, where each transistor or diode is electrically coupled to a bottom electrode 202. Bottom electrode 202 includes TiSiN, TaSiN, TiAlN, TaAlN, W, WN, C, MoN, TiN, TaN, Ti, Ta, Pt, Ir, or other suitable electrode material. Bottom electrode 202 is laterally surrounded by dielectric material 208a. Dielectric material 208a includes $TaO_x$, $Al_2O_3$, SiON, $SiO_2$, $SiO_x$, SiN, FSG, BPSG, BSG, or other suitable dielectric material.

Figure 5:
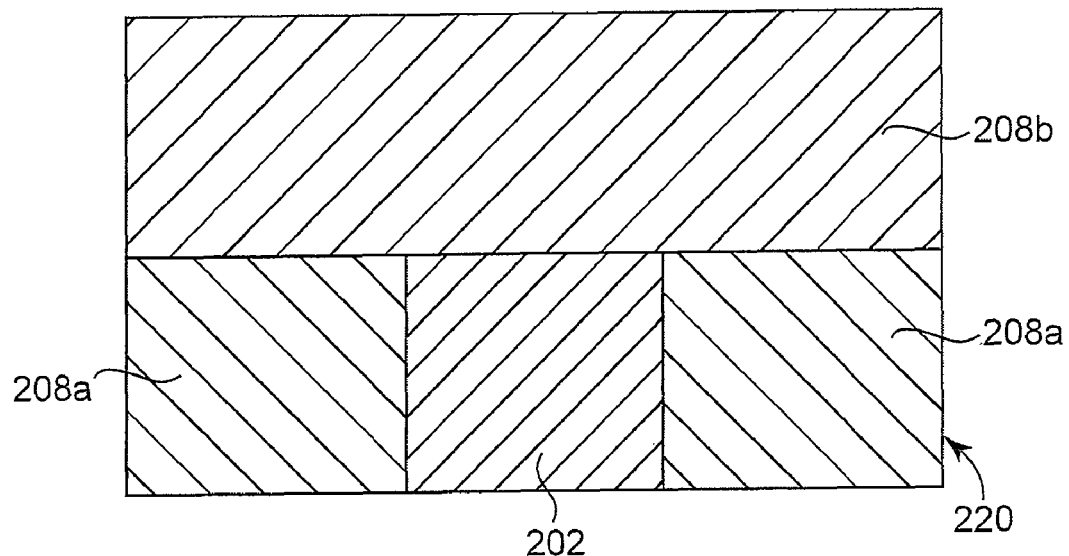
FIG. 5 illustrates a cross-sectional view of one embodiment of the preprocessed wafer and a dielectric material layer.

FIG. 5 illustrates a cross-sectional view of one embodiment of preprocessed wafer 220 and a dielectric material layer 208b. A dielectric material, such as $TaO_x$, $Al_2O_3$, SiON, $SiO_2$, $SiO_x$, SiN, or other suitable dielectric material that will not react with phase change material is deposited over preprocessed wafer 220 to provide dielectric material layer 208b. Dielectric material layer 208b is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), spin on, or other suitable deposition technique.

Figure 6:
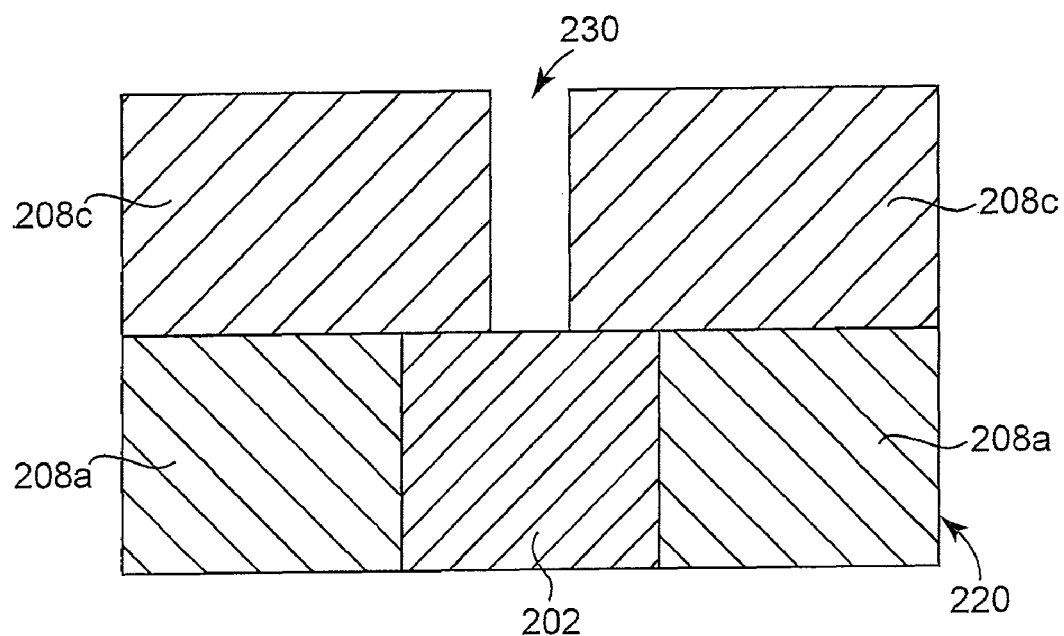
FIG. 6 illustrates a cross-sectional view of one embodiment of the preprocessed wafer and the dielectric material layer after etching the dielectric material layer.

FIG. 6 illustrates a cross-sectional view of one embodiment of preprocessed wafer 220 and dielectric material layer 208c after etching dielectric material layer 208b. Dielectric material layer 208b is etched to provide opening 230. Opening 230 exposes a portion of bottom electrode 202 to provide dielectric material layer 208c. In one embodiment, the width of opening 230 is further reduced using a spacer process. In one embodiment, opening 230 is a via or pore exposing a portion of a single bottom electrode 202. In another embodiment, opening 230 is a trench exposing a portion of two or more bottom electrodes 202 along a row or column of memory array 101.

Figure 7:
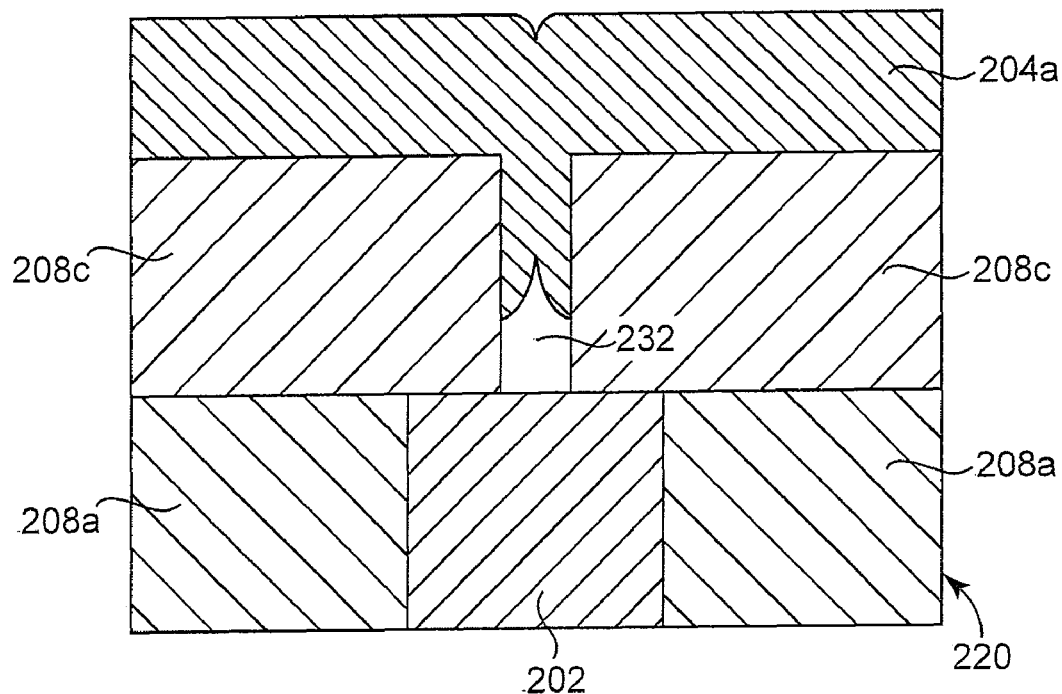
FIG. 7 illustrates a cross-sectional view of one embodiment of the preprocessed wafer, the dielectric material layer, and a phase change material layer.

FIG. 7 illustrates a cross-sectional view of one embodiment of preprocessed wafer 220, dielectric material layer 208c, and a phase change material layer 204a. A phase change material, such as a chalcogenide compound material or other suitable phase change material is deposited over exposed portions of preprocessed wafer 220 and dielectric material layer 208c to provide phase change material layer 204a. Phase change material layer 204a is sputter deposited in a vacuum such that no organic or reactive contaminants are introduced into the phase change material. Since a sputter deposition typically cannot fill high aspect ratio openings, such as opening 230, a void 232 is present in opening 230 after the deposition of phase change material layer 204a. In another embodiment, two or more phase change material layers are deposited over exposed portions of preprocessed wafer 220 and dielectric material layer 208c to provide multiple phase change material layers.

Figure 8:
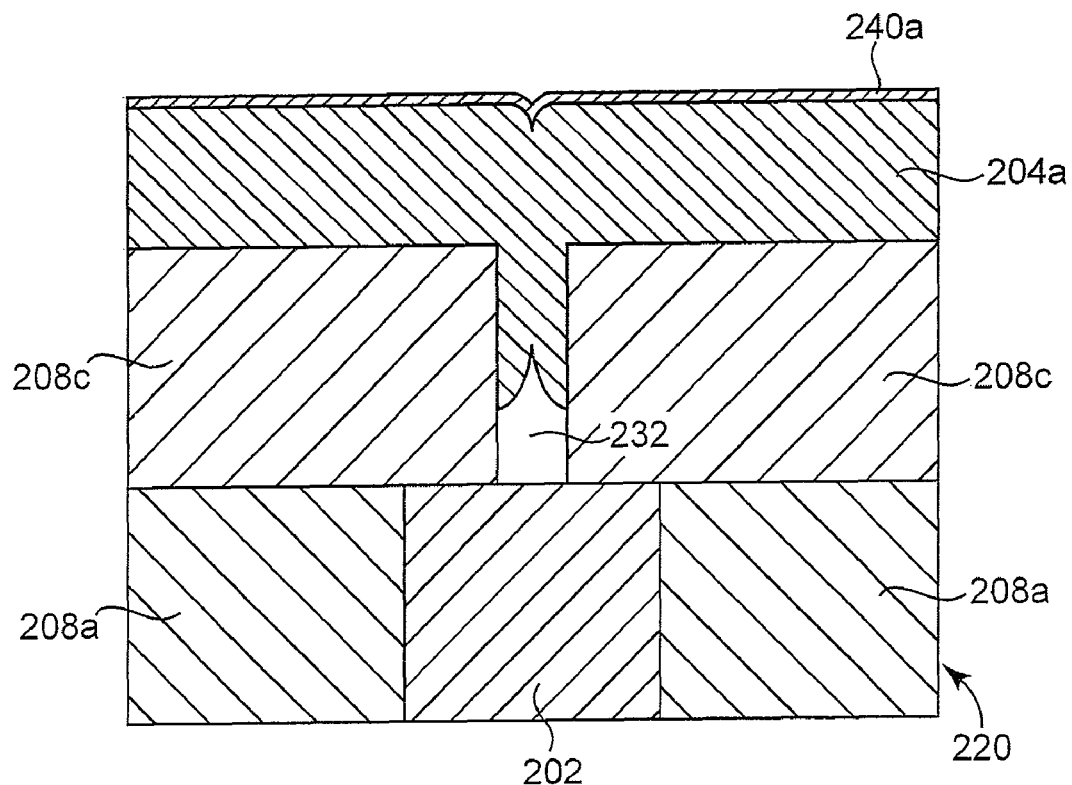
FIG. 8 illustrates a cross-sectional view of one embodiment of the preprocessed wafer, the dielectric material layer, the phase change material layer, and an optional gas tight cap layer.

FIG. 8 illustrates a cross-sectional view of one embodiment of preprocessed wafer 220, dielectric material layer 208c, phase change material layer 204a, and an optional gas tight cap layer 240a. A cap material, such as TaN, $Al_2O_3$, TaAlN, SiN, Si, or other suitable metal or dielectric cap material is optionally conformally deposited over phase change material layer 204a to provide gas tight cap layer 240a. Gas tight cap layer 240a is deposited using CVD, HDP-CVD, ALD, MOCVD, PVD, JVD, or other suitable deposition technique. In another embodiment, optional gas tight cap layer 240a is excluded if phase change material layer 204a is already gas tight.

Figure 9:
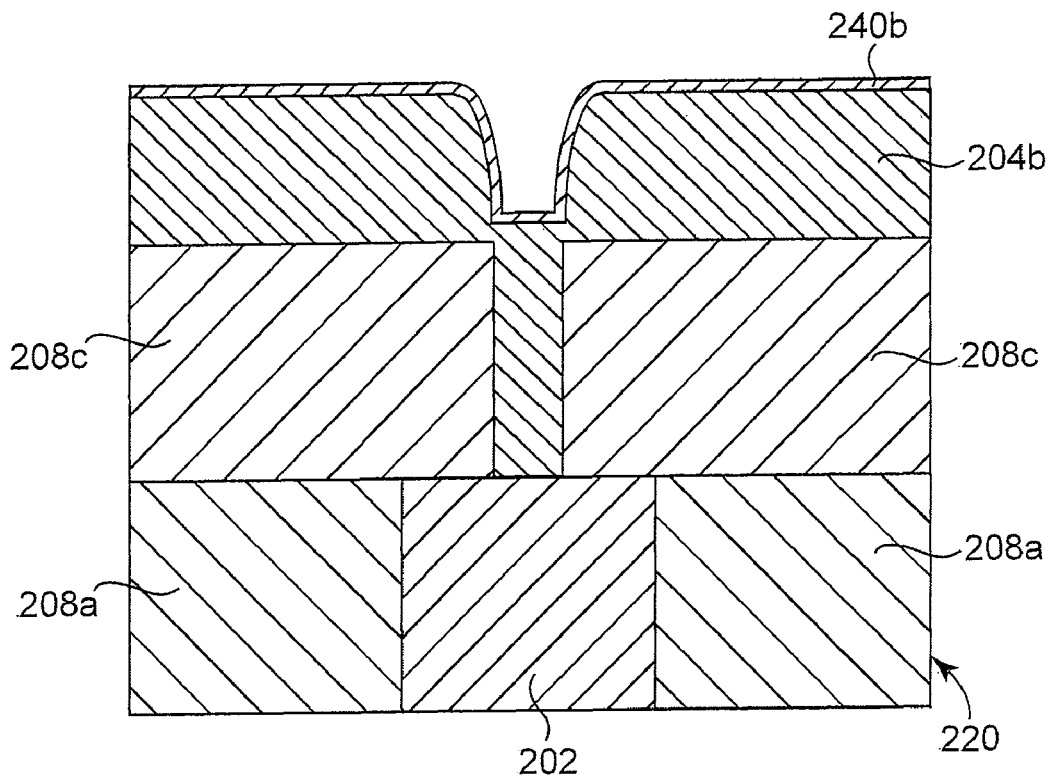
FIG. 9 illustrates a cross-sectional view of one embodiment of the preprocessed wafer, the dielectric material layer, the phase change material layer, and the optional cap layer after force-filling.

FIG. 9 illustrates a cross-sectional view of one embodiment of preprocessed wafer 220, dielectric material layer 208c, phase change material layer 204b, and optional gas tight cap layer 240b after force-filling. Void 232 in opening 230 and any other voids within opening 230 are force-filled with phase change material from phase change material layer 204a to provide phase change material layer 204b and gas tight cap layer 240b. In one embodiment, opening 230 is force-filled by applying an ambient pressure between approximately 1-20 bar to gas tight cap layer 240a and phase change material layer 204a. In addition to the applied pressure, an optional anneal at a temperature between approximately 150-350° C. is performed. In one embodiment, the temperature of the anneal is selected to exceed the crystallization temperature of the phase change material to gain a density increase during the crystallization.

Figure 10:
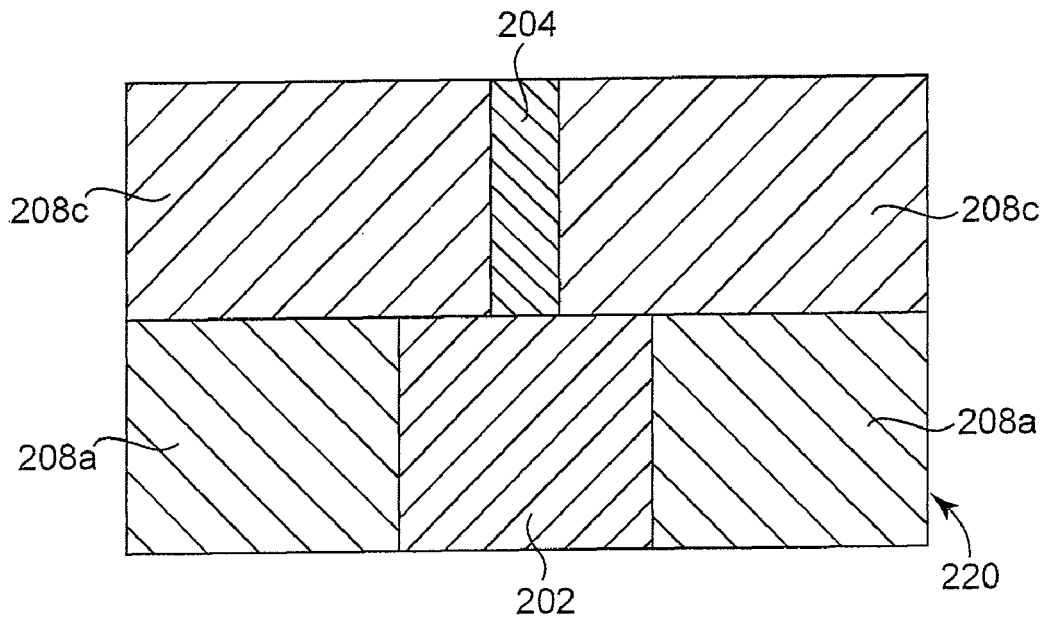
FIG. 10 illustrates a cross-sectional view of one embodiment of the preprocessed wafer, the dielectric material layer, and a phase change material storage location after planarization.

FIG. 10 illustrates a cross-sectional view of one embodiment of preprocessed wafer 220, dielectric material layer 208c, and a phase change material storage location 204 after planarization. Gas tight cap layer 240b and phase change material layer 204b are optionally planarized exposing dielectric material layer 208c to provide phase change material storage location 204. Gas tight cap layer 240b and phase change material layer 204b are planarized using chemical mechanical planarization (CMP) or another suitable planarization technique. By planarizing phase change material layer 204b instead of etching phase change material layer 204b, chemical impurities are not introduced into the phase change material. Additional deposition and etching processes are then used to fabricate top electrode 206 of phase change element 200 previously described and illustrated with reference to FIG. 3.

Embodiments provide phase change elements including void free and organic or reactive contaminant free force-filled phase change material. In addition, the materials contacting the phase change material are selected such that they do not react with the phase change material. In this way, the endurance of the phase change elements is increased compared to typical phase change elements.

While the specific embodiments described herein substantially focused on using phase change memory elements, the present invention can be applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a dielectric material;
   a first electrode disposed in a first opening in the dielectric material;
   a second electrode disposed in a second opening in the dielectric material so that the second electrode is spaced apart from the first electrode; and a resistivity changing material interposed between the first electrode and the second electrode in a third opening in the dielectric material that extends from the first electrode to the second electrode so that the resistivity changing material contacts the first electrode at one end and contacts the second electrode at another end, the resistivity changing material being void free and free of organic and reactive contaminants.

2. The integrated circuit of claim 1, wherein the resistivity changing material comprises a phase change material.

3. The integrated circuit of claim 1, wherein the resistivity changing material comprises a plurality of layers of phase change material.

4. The integrated circuit of claim 1, wherein the resistivity changing material comprises a graded composition of two or more phase change materials.

5. The integrated circuit of claim 1, wherein a region of the dielectric material laterally surrounding the resistivity changing material is compositionally different than a region of the dielectric material laterally surrounding at least one of the first and second electrodes.

6. The integrated circuit of claim 1, wherein the integrated circuit is a memory device.

* * * * *